US011831306B2

(12) United States Patent
Jefremow et al.

(10) Patent No.: US 11,831,306 B2
(45) Date of Patent: Nov. 28, 2023

(54) ELECTRONIC DEVICE

(71) Applicant: Infineon Technologies AG, Neubiberg (DE)

(72) Inventors: Mihail Jefremow, Augsburg (DE); David Zipperstein, Munich (DE); Juergen Schaefer, Oberhaching (DE); Holger Dienst, Feldkirchen (DE); Markus Bichl, Feldkirchen-Westerham (DE); Ralph Mueller-Eschenbach, Munich (DE); Arndt Voigtlaender, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/836,181

(22) Filed: Jun. 9, 2022

(65) Prior Publication Data
US 2022/0399886 A1    Dec. 15, 2022

(30) Foreign Application Priority Data

Jun. 10, 2021   (DE) ..................... 10 2021 115 021.3

(51) Int. Cl.
*H03K 17/56* (2006.01)
*H03M 3/00* (2006.01)
*G01S 7/03* (2006.01)

(52) U.S. Cl.
CPC ............ *H03K 17/56* (2013.01); *H03M 3/458* (2013.01); *H03M 3/50* (2013.01); *G01S 7/03* (2013.01)

(58) Field of Classification Search
CPC ........ H03K 17/56; H03M 3/458; H03M 3/50; G01S 7/03; G05F 1/575; G05F 1/56;
(Continued)

(56) References Cited

U.S. PATENT DOCUMENTS 9,501,073 B2 *  11/2016  Petrov ....................... G05F 1/56
10,216,209 B1 *  2/2019  Ham ....................... G05F 1/575
(Continued)

FOREIGN PATENT DOCUMENTS

DE         2615752 A1   10/1977
DE        10211075 A1   10/2003
(Continued)

*Primary Examiner* — John W Poos
*Assistant Examiner* — Tyler J Pereny
(74) *Attorney, Agent, or Firm* — Eschweiler & Potashnik, LLC (57) ABSTRACT

According to an example, an electronic device includes a component, a supply line providing a supply voltage, a transistor with a control input, a linear first control loop, and a non-linear second control loop. The transistor outputs an output voltage to the component depending on a signal applied to the control input. The linear first control loop includes an ADC to convert an analog output voltage level into a digital measurement signal, a controller to generate a digital control signal for the transistor depending on the digital measurement signal, and a DAC to convert the digital control signal into a first analog control signal. The non-linear second control loop is configured to generate a second analog control signal depending on the analog output voltage level. The second analog control signal is superimposed with the first analog control signal and the combined control signals are fed to the control input of the transistor.

20 Claims, 10 Drawing Sheets

(58) Field of Classification Search
CPC . G05F 1/563; G05F 1/468; G05F 1/59; G05F 1/565; G05F 1/461; G05F 1/571; G05F 1/614; H02M 3/157; H02M 3/156; H02M 1/00; H02M 1/0045; H02M 3/158; H02M 3/1582
See application file for complete search history.

(56) References Cited

U.S. PATENT DOCUMENTS

| | | |
|---|---|---|
| 2003/0174081 A1 | 9/2003 | Bruckmann et al. |
| 2010/0225295 A1* | 9/2010 | Kranz ................. G05F 1/59 323/311 |
| 2013/0119954 A1* | 5/2013 | Lo ..................... G05F 1/10 323/280 |
| 2014/0253071 A1 | 9/2014 | Hammerschmidt |
| 2016/0246342 A1* | 8/2016 | Muthukaruppan ....... G05F 1/59 |
| 2017/0019120 A1* | 1/2017 | Mallett ................ H03M 3/458 |
| 2017/0324324 A1 | 11/2017 | Ballarin |
| 2021/0271277 A1 | 9/2021 | Ahmed et al. |
| 2021/0336531 A1* | 10/2021 | Murakami ............. G05F 1/575 |

FOREIGN PATENT DOCUMENTS

| | | |
|---|---|---|
| DE | 102014102860 A1 | 9/2014 |
| DE | 102017109615 A1 | 11/2017 |
| DE | 112019002299 T5 | 3/2021 |
| KR | 20150069408 A | 6/2015 |
| WO | WO-2020055695 A1 * | 3/2020 |

\* cited by examiner

ELECTRONIC DEVICE

REFERENCE TO RELATED APPLICATIONS

This application claims priority to German Application 10 2021 115 021.3, filed on Jun. 10, 2021. The contents of the above-referenced Patent Applications are hereby incorporated by reference in their entirety.

TECHNICAL FIELD

Examples relate to electronic devices in general.

BACKGROUND

Electronic devices can contain multiple different components that need to be supplied with possibly different voltages. In addition to the requirement for a specific supply voltage, other requirements may also exist depending on the component, for example noise isolation from a power supply. It is desirable to supply components of electronic devices with the required power in an efficient manner (e.g. with the fewest possible additional components and/or minimum chip area consumption), while ensuring that the respective requirements are met.

BRIEF DESCRIPTION OF THE DRAWINGS

The figures do not reflect the actual proportions, but are intended to illustrate the principles of the various examples. In the following text various examples are described with reference to the following figures.

DESCRIPTION

The following detailed description refers to the enclosed figures, which show details and examples. These examples are described in sufficient detail to enable the person skilled in the art to embody the invention. Other embodiments are also possible, and the examples can be modified in terms of their structural, logical and electrical aspects without deviating from the subject matter of the invention. The different examples are not necessarily mutually exclusive, but different embodiments can be combined to create new embodiments. For the purposes of this description, the terms "connected" and "coupled" are used to describe both a direct and an indirect connection, as well as a direct or indirect coupling.

Figure 1:
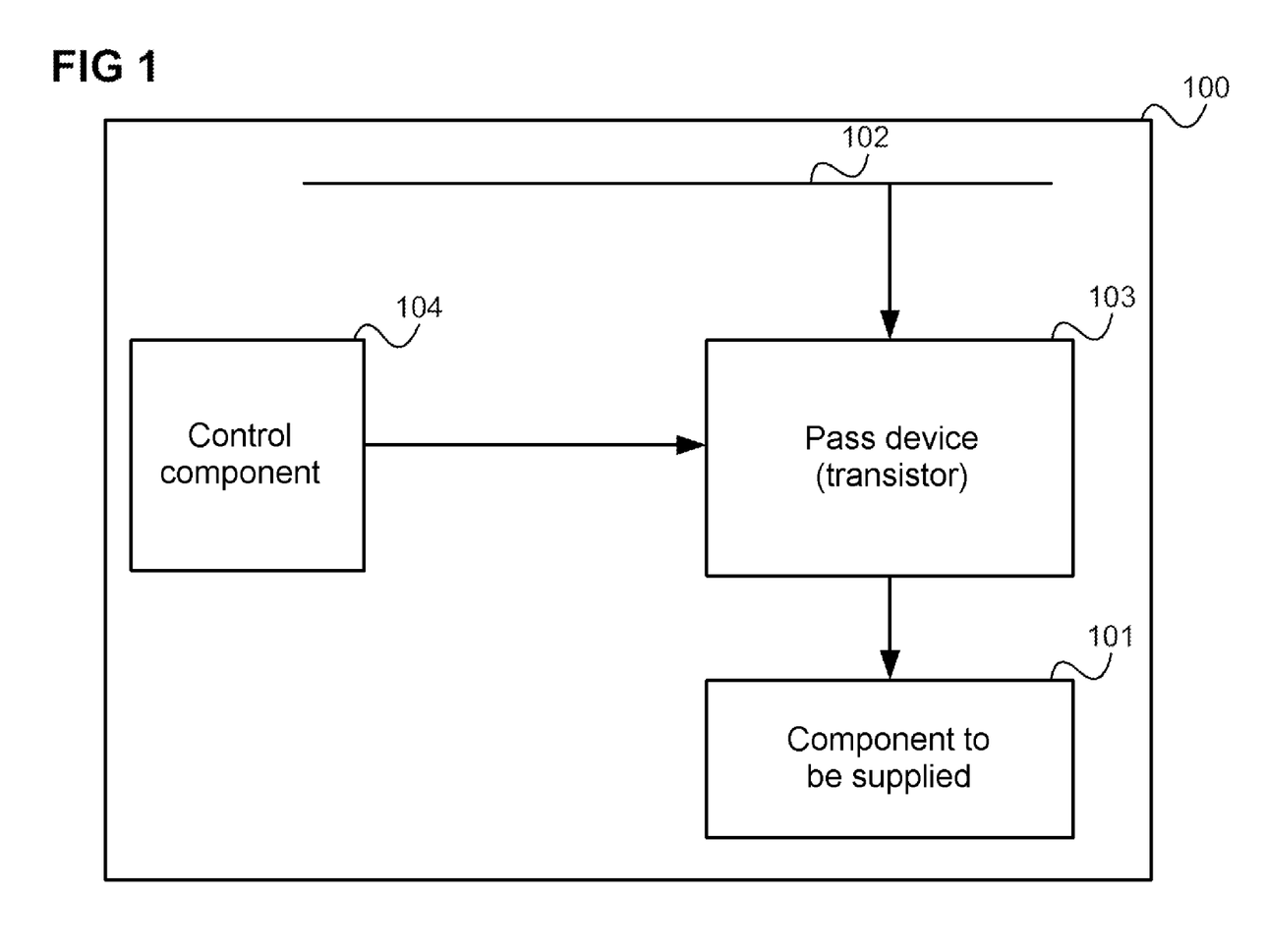
FIG. 1 illustrates the power supply of a component to be supplied in an electronic device, in accordance with various aspects described.

FIG. 1 illustrates an example of a power supply of a component 101 to be supplied with power in an electronic device 100.

The electronic device 100 includes a supply line 102. The supply line 102 can be connected to an external power supply via a connector. For example, the electronic device 100 may be arranged in a vehicle and the supply line 102 is connected to a battery of the vehicle. However, the supply line 102 can also be connected to an internal battery of the electronic device 100.

The supply line 102 is not directly connected to the component 101 to be supplied, but via a transfer component known as a pass device 103, typically a transistor (field-effect transistor or bipolar transistor). This can be the case, for example, because the component 101 to be supplied requires a different voltage than that delivered by the supply line 102. For example, in a vehicle, the supply line 102 delivers a voltage of 12V and the component to be supplied may require, for example, 3.3V. Another reason for the pas device 103 may be that the component 101 to be supplied is sensitive to voltage fluctuations in the power supply. In this case, the pass device 103 is used to regulate the voltage applied to the component 101 to be as stable as possible, if necessary at a level that is below the voltage level of the supply line (e.g. 3.3V instead of 12V). A control component 104 is provided to control the pass device 103.

Figure 2:
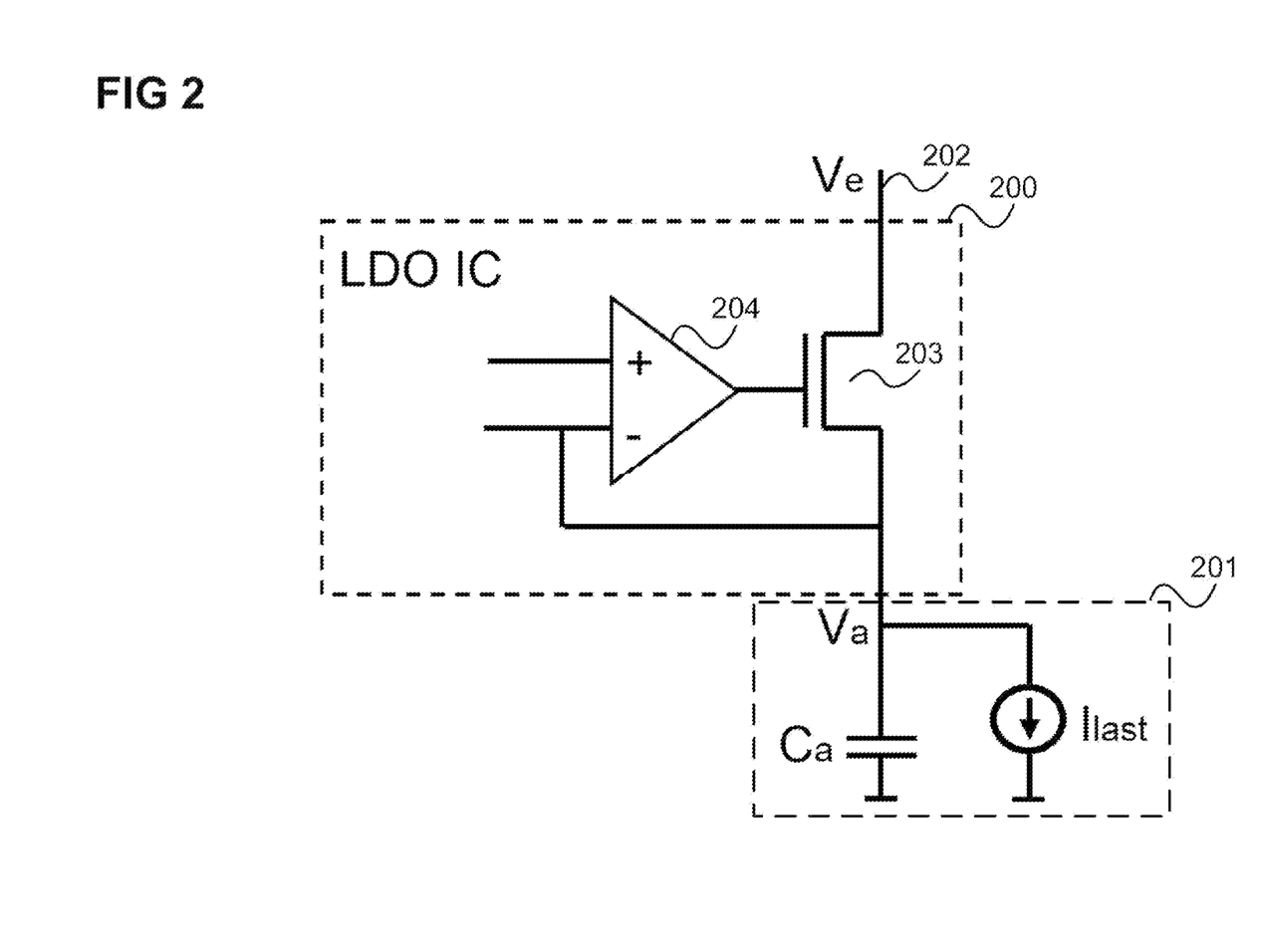
FIG. 2 shows an example of the control of a pass device using a hardware control loop, according to one embodiment.

FIG. 2 shows an exemplary control of a pass device using a hardware control loop.

In this example, the pass device 103 and the control component 104 are implemented by a low-dropout voltage regulator (LDO) 200. In this example, the pass device 103 is a field-effect transistor 203, the gate of which is controlled by a differential amplifier 204. The supply line 202 applies an input voltage to the field effect transistor 203 and the output voltage output by the transistor 203 is compared with a reference by the differential amplifier 204. The differential amplifier 204 controls the gate of the differential amplifier 204 according to the result of the comparison. The output voltage is fed to the component 201. In this example, the control component thus uses one (or possibly more) hardware loops to provide a stable output voltage during possibly time-variable conditions. The variable conditions include, for example, characteristics of the pass device 203, capacitance of the component to be supplied, load current consumed by the component 201.

When the illustrated type of output voltage regulation is used, there is typically a fixed trade-off between settling time and response time. The noise characteristic of the voltage regulator 200 is primarily determined by analog parameters (device physics, power consumption, size, and so on) of the first input stage. The first stage refers to the component 204, since in practice the differential amplifier is typically built from a plurality of amplifier stages and also comprises a plurality of analog loops.

Figure 3:
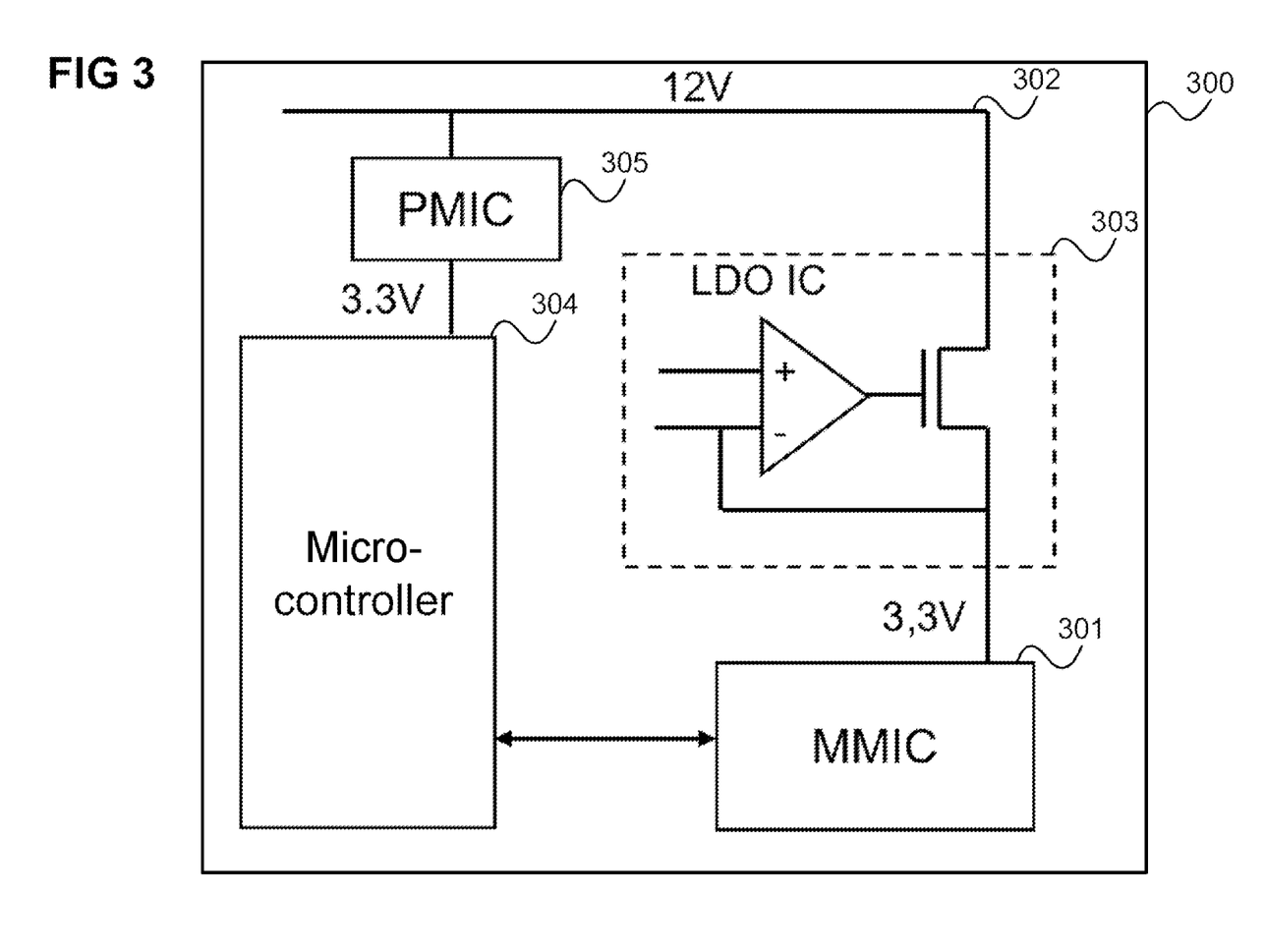
FIG. 3 illustrates the use of the voltage regulator from FIG. 2 in a radar device, in accordance with various aspects described.

FIG. 3 illustrates an exemplary use of the voltage regulator from FIG. 2 in a radar device 300.

In this example, the component to be supplied is an MMIC 301 (Monolithic Microwave Integrated Circuit). The MMIC 301 is supplied by a voltage regulator 303, which in turn is supplied by a supply line 302 (possibly via a pre-regulator), as described with reference to FIG. 2.

The radar device 300 includes a microcontroller 304 (e.g. an MCU (micro controller unit) for radar signal processing. The microcontroller 304 processes radar data supplied by the MMIC 301 (e.g. by performing one or more Fourier transformations (FFT) and/or a post-processing of digital radar reception signals, e.g. for direction determination) and delivers radar signals, sent via the MMIC 301, to the MMIC 301. The radar signal processing is performed as specified by software running on the microcontroller 304.

The microcontroller 304 (e.g. an AURIX from Infineon Technologies AG) is supplied with power by a separate power supply circuit 305, here a PMIC (Power Management IC), which is supplied from the power line 302.

In such an application, the voltage regulator 303 (which is external to the MMIC 301) is used to achieve noise isolation from the supply line 302 for the MMIC 301. The voltage regulator 303, however, increases the space requirements and the costs of the radar device 300. Depending on the application, the output of the voltage regulator 303 must also be monitored to ensure safety conditions are met (e.g. when used in a vehicle).

In order to avoid the requirement of an external voltage regulator 303, in accordance with various embodiments the microcontroller 304 is used, in addition to its use for radar signal processing, to control a pass device, and in this manner to control a supply voltage for the MMIC 301. For example, a flexible software-based multi-loop control may be implemented using the microcontroller 304, which can meet different requirements of various components and loads (external to the microcontroller) to be supplied.

Figure 4:
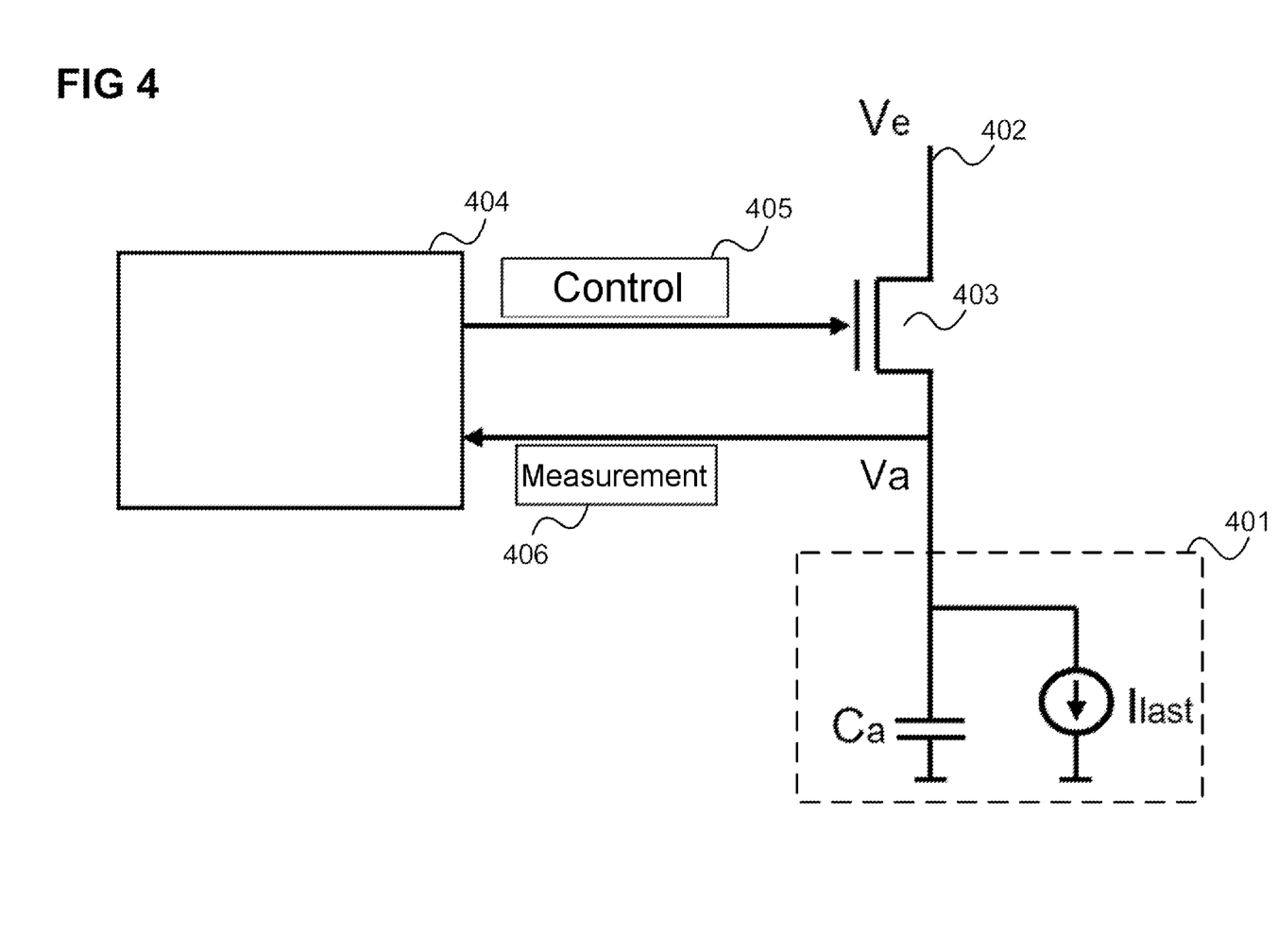
FIG. 4 shows a control of a pass device using a microcontroller, in accordance with various aspects described.

FIG. 4 shows an exemplary control of a pass device 403 by means of a microcontroller 404.

The pass device 403 (which is external to the microcontroller 404) is a field-effect transistor, for example, the gate of which is fed with a control signal generated by the microcontroller 404. As in the previous examples, an input voltage is fed to the field-effect transistor 403 from a supply line 402.

The microcontroller 404 generates the control signal 405 depending on a measurement signal 406, which indicates the output voltage currently output by the field-effect transistor 403. The microcontroller 404 executes appropriate open-loop (or closed-loop) control software for this purpose.

In this case, the control component 104 is thus implemented by software executed on the microcontroller 404 to provide a stable output voltage during possibly time-variable conditions. The time-variable conditions include characteristics of the pass device 403, capacitance of the component 401 to be supplied, load current consumed by the component 401.

Figure 5:
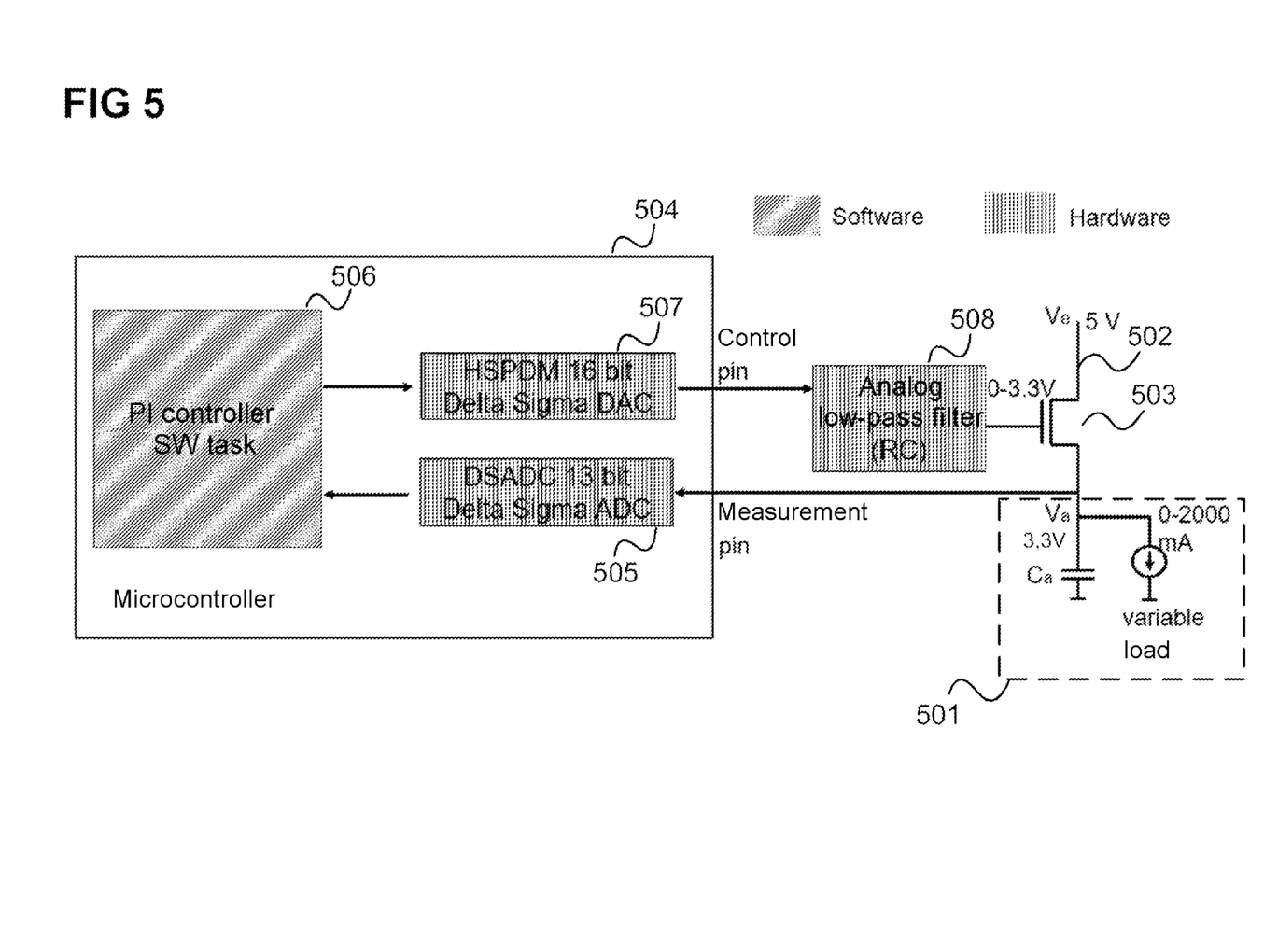
FIG. 5 illustrates the control of a pass device to supply a component to be supplied using a single control loop implemented by a microcontroller, in accordance with various aspects described.

FIG. 5 illustrates an exemplary control of a pass device 503 to supply a component 501 using a single control loop implemented by a microcontroller 504.

As in FIG. 4, the pass device 503 is a field-effect transistor (e.g. an NMOS depletion transistor), which is supplied by a supply line 502.

The microcontroller 504 receives an analog measurement signal via an input pin (e.g. measurement pin) and has a (hardware) delta-sigma analog-to-digital converter (ADC) 505, which converts the analog measurement signal, which is an analog signal for measuring the output voltage of the pass device 503, into a digital measurement signal and feeds the digital measurement signal to a software task 506 running on a processor of the microcontroller 504. The software task 506 implements a PI control system and generates a digital control signal from the digital measurement signal. This is converted by a (hardware) sigma-delta digital-to-analog converter (DAC) 507 of the microcontroller 504 into an analog control signal, which is filtered by an analog low-pass filter (e.g. an RC filter) 508 and then fed to the gate of the field-effect transistor 503.

The delta-sigma ADC/DAC-based control loop shown in FIG. 5, in particular the delta-sigma ADC, enables very precise control of the output voltage. The properties of the sigma-delta DAC and the low-pass filter define the noise characteristic of the controller. The delta-sigma ADC/DAC-based control loop enables noise shaping, which allows noise signals to be shifted into non-interfering frequency ranges. For example, noise can be shifted into frequency ranges that do not interfere with the signal processing performed by the MMIC 301.

The loop bandwidth is primarily defined by the digital filters of the delta-sigma ADC and is relatively low (order of magnitude of 10 kHz). In order to achieve a low response time of the closed-loop control and, for example, to be able to react quickly to rapid load changes, a further control loop (also referred to as a gain loop) is added in accordance with various embodiments, as explained in the following with reference to FIG. 6.

Figure 6:
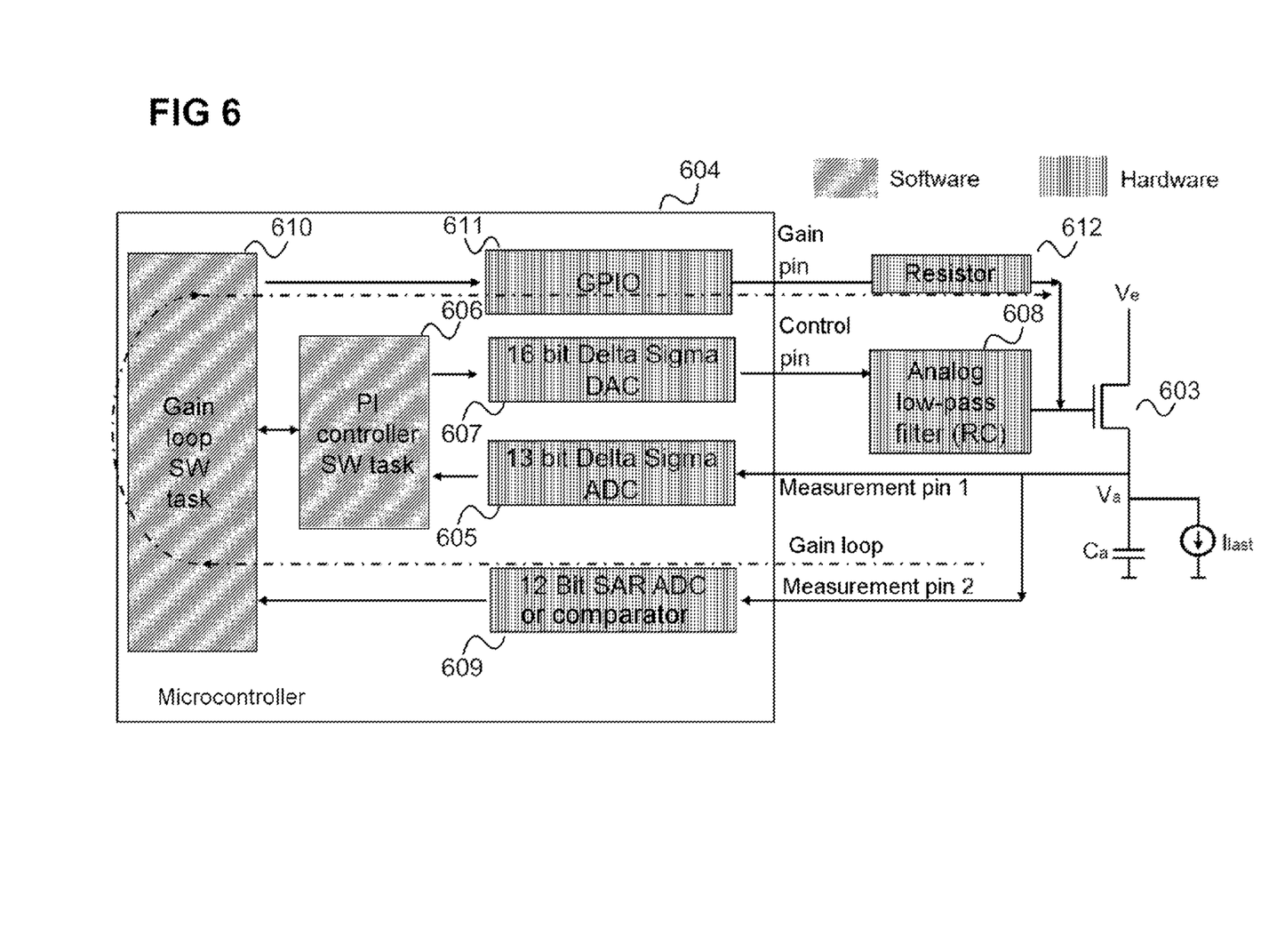
FIG. 6 illustrates the control of a pass device by means of two superimposed control loops implemented by a microcontroller, in accordance with various aspects described.

FIG. 6 illustrates an exemplary control of a pass device 603 by means of two superimposed control loops implemented by a microcontroller 604.

Analogously to FIG. 5, a first delta-sigma ADC/DAC-based control loop is implemented using a delta-sigma ADC 605, a first software task 606 implemented in the controller 604, a delta-sigma DAC 607, and a low-pass filter 608. The analog control signal for the gate of the transistor 603, output by this first control loop, is superimposed with a second analog control signal, which is generated by a second control loop.

The second control loop is formed as follows: a second analog-to-digital converter 609 receives an analog measurement of the output voltage and from it generates a digital measurement signal. The second analog-to-digital converter 609 is, for example, a SAR (Successive Approximation Register) ADC or a simple fast comparator that compares the analog output voltage with a threshold value and outputs 1 or 0 depending on the result of the comparison. The output of the second analog-to-digital converter 609 is fed to a second software task 610 that the microcontroller executes. The second software task 610 feeds a second analog control signal to the gate of the transistor 603 via an output interface 611 (e.g. a GPIO (General Purpose Input/Output)) of the microcontroller 604 and via a resistor 612, depending on the output of the second analog-to-digital converter 609, so that the second control signal is superimposed on the first control signal (e.g., the second control signal is added to the first control signal). The output interface 611 outputs a gain voltage via a gain pin to the resistor 612.

According to one example, the second analog control signal is a DC signal with two possible levels, either the second software task 610 extracts charge from the gate of the transistor 603 (e.g. if the output voltage is above a threshold value), feeds charge to the gate of the transistor 603 (e.g. if the output voltage is below a threshold value) or neither of these (e.g., by switching the respective output pin of the microcontroller 604 to high impedance). For example, two threshold values may be provided and the second software task 610 controls the output interface 611 to output a positive level DC current if the output voltage is below the lower of the two threshold values, controls the output interface 611 to output a negative level DC current if the output voltage is above the higher of the two threshold values, and switches the output pin of the output interface 611, which is connected to the gate of transistor 603 (via the resistor 612), to high impedance if the output voltage lies between the two threshold values (i.e. within a tolerance range defined by the threshold values).

The comparison can be performed by the second ADC converter 609 or by the second software task 610 (in the event that the ADC converter 609 generates a conversion of the analog to a digital value of the output voltage).

Due to the generation of the second analog control signal on the basis of a (simple) comparison, the second control loop is non-linear. The second control loop enables a rapid response to changes in the output voltage (asynchronously with the first control loop). In other words, the second control loop has a higher control bandwidth than the first loop. The second control loop is also referred to herein as a gain control loop.

Figure 7:
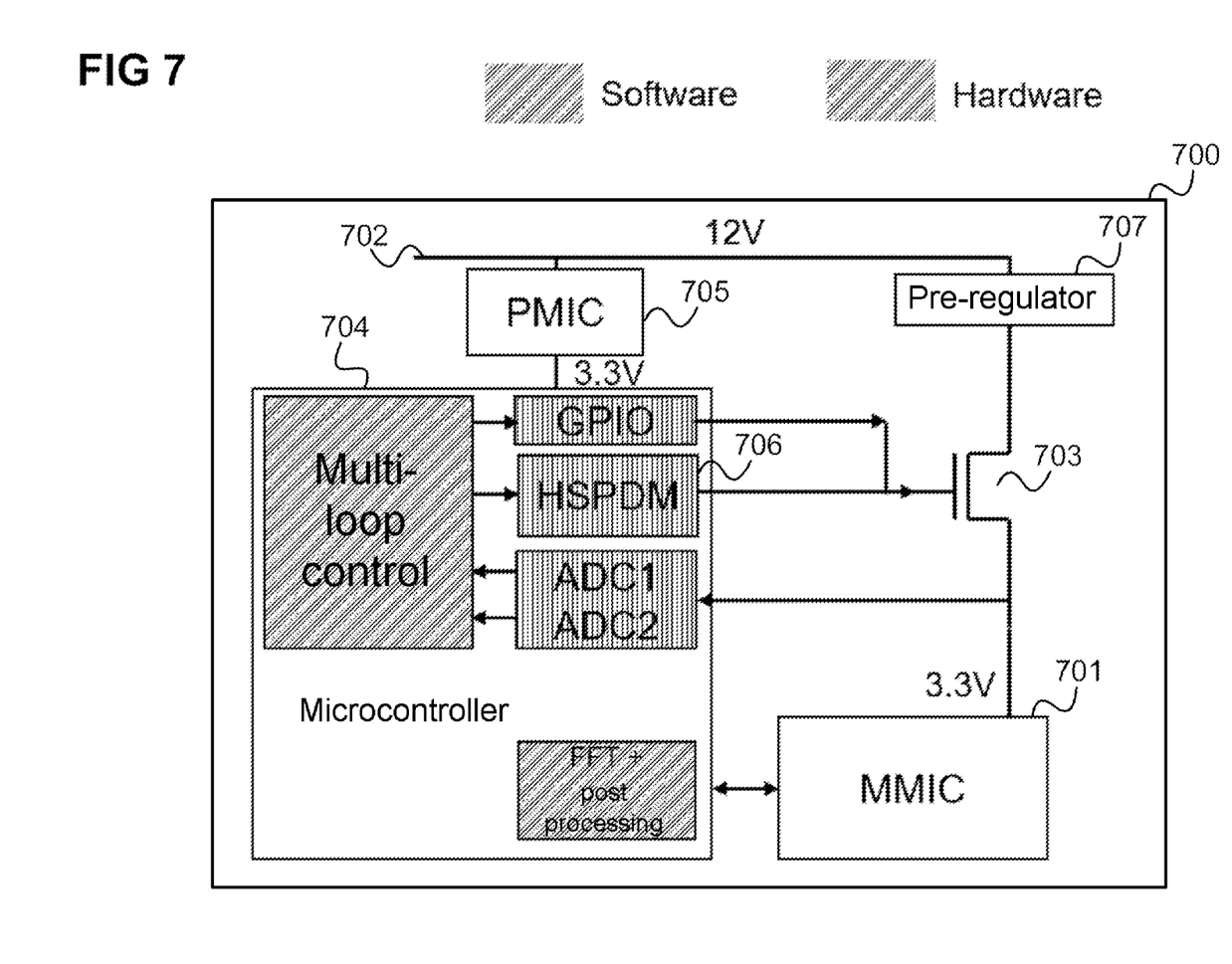
FIG. 7 illustrates the use of the controller of FIG. 6 in a radar device, in accordance with various aspects described.

FIG. 7 illustrates an exemplary use of the controller of FIG. 6 in a radar device 700.

As in the example of FIG. 3, the component to be supplied is an MMIC 701. The MMIC 701 is supplied with power via a transistor 703, which as described with reference to FIG. 7 is controlled by a microcontroller 704. The transistor 703 receives an input current from a supply line 702. In this example, a pre-regulator 707 is provided (e.g. a DC step-down converter for converting from 12V to approximately 4.5V).

The microcontroller 704 (e.g. an AURIX from Infineon Technologies AG) is supplied with power by a separate power supply circuit 705, here a PMIC (Power Management IC), which is supplied from the power line 702. The delta-sigma DAC 607 is implemented here by a HSDPM (High Speed Pulse Density Modulation Module 706).

The microcontroller 704 can provide fail-safe mechanisms in case the output voltage drops too low.

Returning to FIG. 6, a CPU of the microcontroller 604, which executes the software tasks 606, 610, can be connected to the GPIO 611, the DAC 607, the ADC 605 and the second ADC via register interfaces. The low-pass filter 608 can comprise one RC filter or a plurality of RC filters in series.

One or both of the software tasks 606, 610 can also be executed in other modules of the microcontroller 604 instead of in the microcontroller CPU in alternative examples. For example, the software task 610 can be executed in the GPIO 611. In particular, the two software tasks 606, 610 can be executed on different data processing components.

The output interface 611 can comprise a level shifter and a buffer (e.g. in the form of an inverter). This can also be provided at the output of the DAC 607. A digital low-pass filter may be provided between the delta-sigma ADC 605 and the CPU (including, for example a CIC (Cascaded Integrator Comb) filter followed by a FIR (Finite Input Response) filter).

Figure 8:
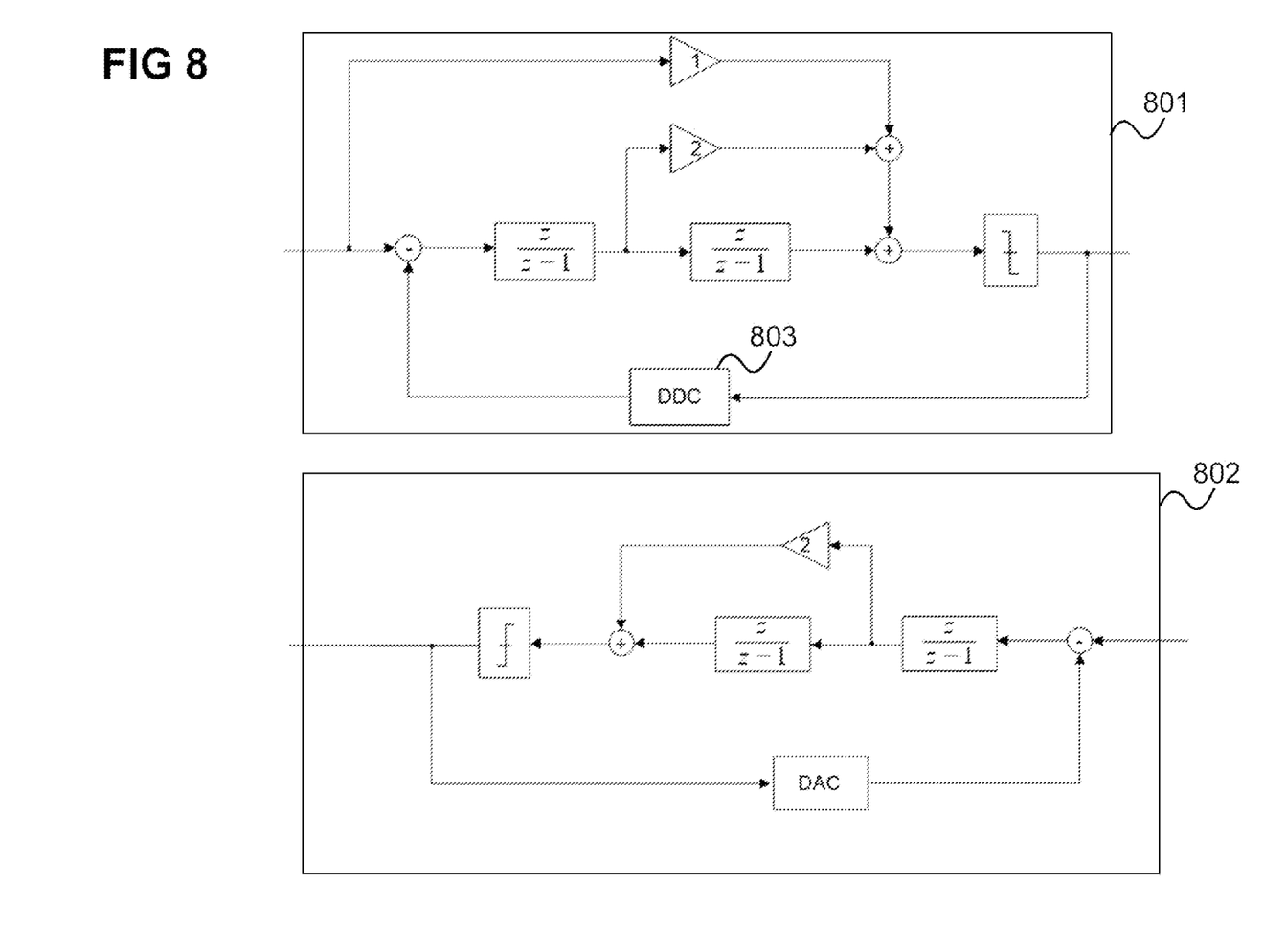
FIG. 8 shows an example of a delta-sigma digital-to-analog converter and an example of a delta-sigma analog-to-digital converter, in accordance with various aspects described.

FIG. 8 shows an example of a delta-sigma DAC 801 and an example of a delta-sigma ADC 802, each of which is second order with fast feed-forward. The delta-sigma DAC 801 has a digital down converter (DDC) 803 in the feedback section.

Figure 9:
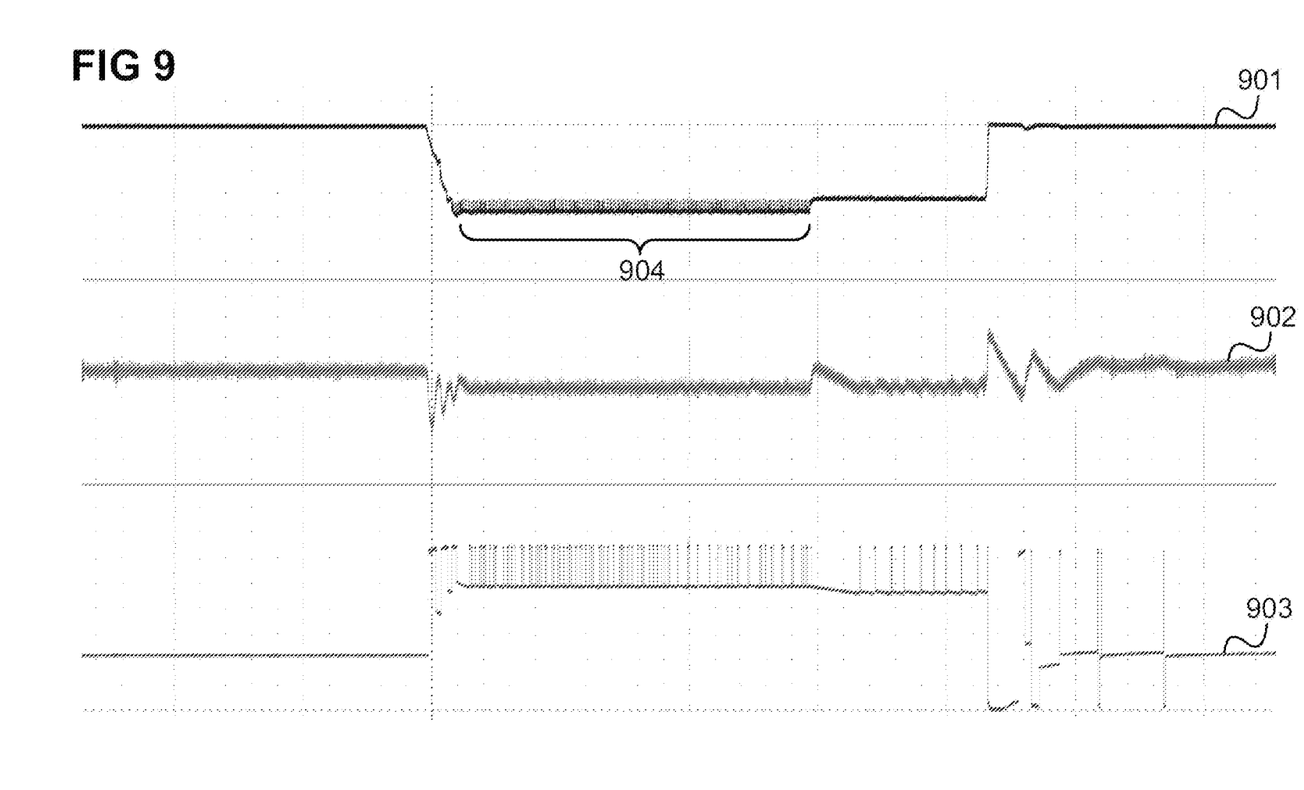
FIG. 9 shows a qualitative curve of the load current, the output voltage, and the gain voltage output by the gain loop, in accordance with various aspects described.

FIG. 9 shows an exemplary qualitative curve of the load current (first graph 901), the output voltage (second graph 902) and the gain voltage output from the gain loop at the gain pin (third graph 903).

In this example, the load current changes (e.g. by approx. 800 mA) and then fluctuates rapidly in a region 904. The change is compensated by the linear first control loop (i.e. the delta-sigma ADC/DAC-based control loop). The fluctuations in the region 904 are compensated by corresponding fast pulses of the gain voltage.

Figure 10:
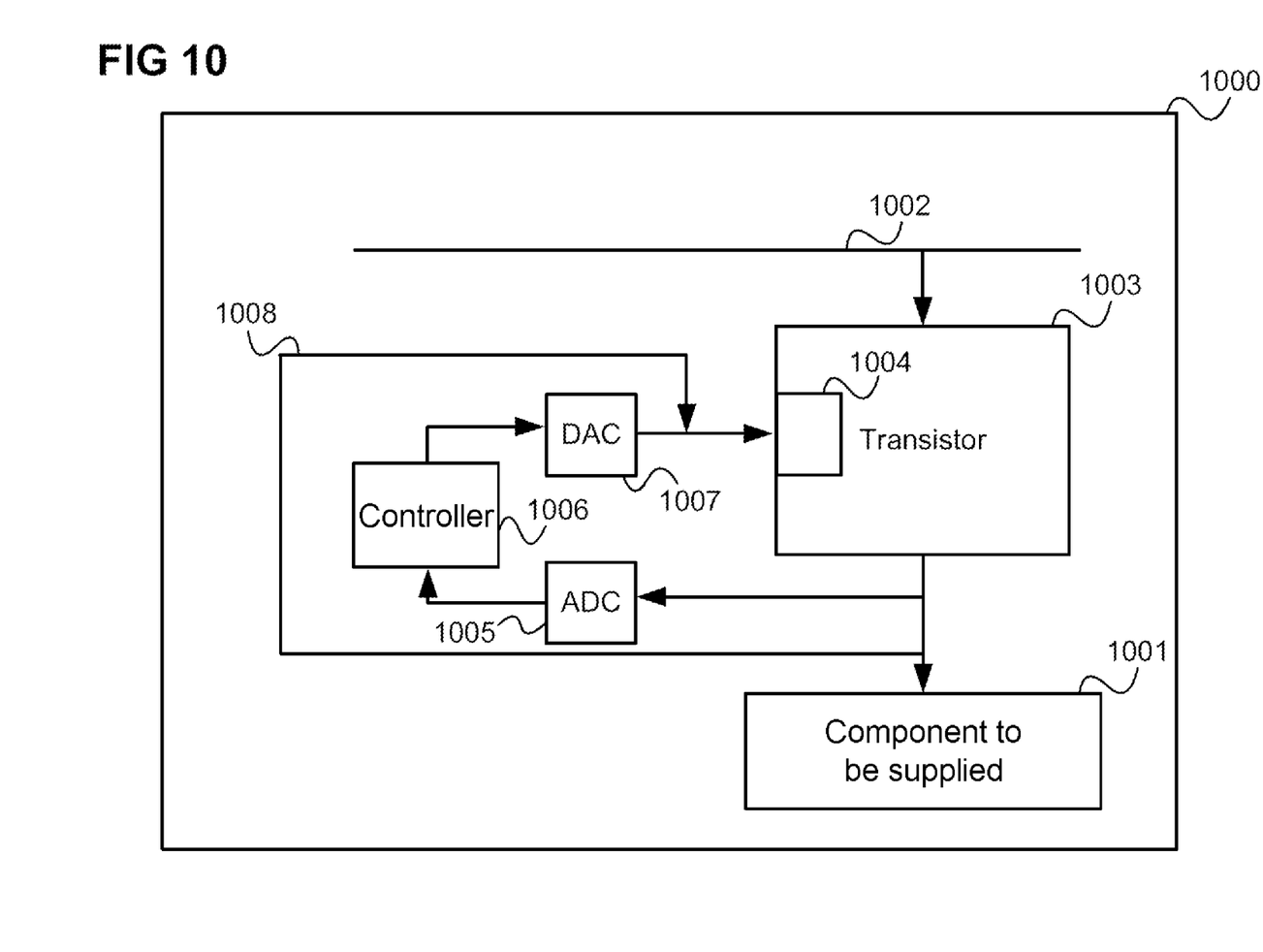
FIG. 10 shows an electronic device, in accordance with various aspects described.

In summary, according to various examples an electronic device as shown in FIG. 10 is provided.

FIG. 10 shows an electronic device 1000 according to one example.

The electronic device 1000 includes a component 1001 to be supplied, a supply line 1002 that provides a supply voltage, and a transistor 1003 with a control input 1004 to which the supply voltage from the supply line is fed and which is configured to output an output voltage depending on its control input 1004 to supply the component 1001.

The electronic device 1000 also includes a linear first control loop, which includes a delta-sigma analog-to-digital converter 1005 configured to convert the analog output voltage level into a digital measurement signal, a controller 1006 configured to generate a digital control signal for the transistor 1003 depending on the digital measurement signal, and a delta-sigma digital-to-analog converter 1007 configured to convert the digital control signal into a first analog control signal and feed it to the control input 1004 of the transistor 1003.

The electronic device 1000 also includes a non-linear second control loop 1008, which is configured to generate a second analog control signal depending on the analog output voltage level and feed it to the control input 1004 of the transistor, superimposed with the first analog control signal.

In other words, two control loops are provided, the first control loop being a linear, delta-sigma ADC/DAC-based control loop that ensures high accuracy, while the second control loop is a non-linear control loop (with higher control bandwidth) that ensures a low response time.

The use of a plurality of control loops also enables a flexible trade-off between settling time and response time, as different peripheral components of a microcontroller can be used for the control loops (e.g. HSPDM for the first control loop and GPIO for the second control loop, as well as different ADCs). Furthermore, due to the use of delta-sigma converters the noise characteristic does not depend primarily on analog parameters.

In the following text, various examples are specified.

Example 1 is an electronic device, including a component to be supplied, a supply line providing a supply voltage; a transistor to which the supply voltage is fed from the supply line, the transistor including a control input and configured to output an output voltage depending on a signal applied to the control input to supply the component; a linear first control loop, and a non-linear control loop. The linear first control loop includes a delta-sigma analog-to-digital converter configured to convert an analog output voltage level into a digital measurement signal, a controller configured to generate a digital control signal for the transistor depending on the digital measurement signal, and a delta-sigma digital-to-analog converter configured to convert the digital control signal into a first analog control signal and feed it to the control input of the transistor. The non-linear second control loop is configured to generate a second analog control signal depending on the analog output voltage level and feed it to the control input of the transistor, wherein the second analog control signal is superimposed with the first analog control signal.

Example 2 includes the subject matter of example 1, including or omitting optional elements, wherein the controller is configured to generate the digital control signal for the transistor from a control error between an output voltage level indicated by the digital measurement signal and a reference variable for the output voltage.

Example 3 includes the subject matter of example 1, including or omitting optional elements, wherein the controller is a PI controller.

Example 4 includes the subject matter of example 1, including or omitting optional elements, wherein the delta-sigma digital-to-analog converter is configured to feed the first analog control signal to the control input of the transistor via a low-pass filter.

Example 5 includes the subject matter of example 1, including or omitting optional elements, wherein the non-linear second control loop includes a comparator configured to compare the analog output voltage level with a threshold value, and generate the second analog control signal dependent on a result of the comparison.

Example 6 includes the subject matter of example 1, including or omitting optional elements, wherein the non-linear second control loop includes an analog-to-digital converter configured to convert the analog output voltage level into a digital level of the output voltage, compare the digital level of the output voltage with a threshold value, and generate the second analog control signal depending on a result of the comparison.

Example 7 includes the subject matter of example 1, including or omitting optional elements, wherein the second analog control signal has one of two levels.

Example 8 includes the subject matter of example 1, including or omitting optional elements, wherein the transistor is a field-effect transistor and wherein the non-linear second control loop is configured to generate the second analog control signal depending on the analog output voltage level, wherein charge is extracted from a gate of the field-effect transistor or charge is fed to the gate of the field-effect transistor based on the second analog control signal.

Example 9 includes the subject matter of example 1, including or omitting optional elements, wherein the non-linear second control loop is configured not to feed the second analog control signal to the control input of the transistor if the analog output voltage level lies within a pre-defined tolerance range.

Example 10 includes the subject matter of example 1, including or omitting optional elements, including a microcontroller with a processor, wherein the controller is implemented by a software task running on the processor.

Example 11 includes the subject matter of example 10, including or omitting optional elements, wherein the microcontroller includes the delta-sigma analog-to-digital converter and the delta-sigma digital-to-analog converter.

Example 12 includes the subject matter of example 10, including or omitting optional elements, wherein the second non-linear control loop is implemented by a digital-to-analog converter or a comparator of the microcontroller, a further software task running on the processor, and an output interface of the microcontroller.

Example 13 includes the subject matter of example 1, including or omitting optional elements, wherein the electronic device is a radar device and the component to be supplied is a monolithic microwave integrated circuit.

Example 14 is a method for controlling an output voltage supplied to a component of an electronic device, including generating a first control signal based on a control error between an output voltage level of a transistor and a reference variable for the output voltage level; generating a second control signal based on a comparison of the output voltage level of the transistor and at least one threshold voltage; and feeding the first control signal and the second control signal, superimposed with respect to one another, to a gate of the transistor to control the transistor to output the output voltage.

Example 15 includes the subject matter of example 14, including or omitting optional elements, including converting the output voltage level into a digital measurement signal, generating a digital control signal for the transistor depending on the digital measurement signal, and converting the digital control signal into the first control signal.

Example 16 includes the subject matter of example 14, including or omitting optional elements, including filtering the first control signal with a low-pass filter and feeding the filtered first control signal to the gate of the transistor.

Example 17 includes the subject matter of example 14, including or omitting optional elements, including generating the second control signal to exhibit either a first value that causes charge to be extracted from the gate of the transistor when the output voltage level exceeds a first threshold or a second value that causes charge to be fed to the gate of the transistor when the output voltage level is below a second threshold.

Example 18 includes the subject matter of example 17, including or omitting optional elements, including generating the second control signal to exhibit a third value that causes the gate of the transistor to be tied to a high impedance input when the output voltage level lies between the first threshold and the second threshold.

Example 19 is a power supply system for a component of an electronic device, including a transistor to which supply voltage is fed from a supply line, the transistor including a control input and configured to output an output voltage depending on a signal applied to the control input, wherein the output voltage is provided to the component. The power supply system includes a linear first control loop, including a delta-sigma analog-to-digital converter configured to convert an analog output voltage level into a digital measurement signal, a controller configured to generate a digital control signal for the transistor depending on the digital measurement signal, and a delta-sigma digital-to-analog converter configured to convert the digital control signal into a first analog control signal and feed it to the control input of the transistor. The power supply system includes a non-linear second control loop, configured to generate a second analog control signal depending on the analog output voltage level and feed it to the control input of the transistor, wherein the second analog control signal is superimposed with the first analog control signal.

Example 20 includes the subject matter of example 19, including or omitting optional elements, wherein the controller is configured to generate the digital control signal for the transistor from a control error between an output voltage level indicated by the digital measurement signal and a reference variable for the output voltage.

Example 21 includes the subject matter of example 19, including or omitting optional elements, including a low-pass filter and wherein the delta-sigma digital-to-analog converter is configured to feed the first analog control signal to the control input of the transistor via the low-pass filter.

Example 22 includes the subject matter of example 19, including or omitting optional elements, wherein the non-linear second control loop includes an analog-to-digital converter configured to convert the analog output voltage level into a digital level of the output voltage, compare the digital level of the output voltage with at least one threshold value, and generate the second analog control signal depending on a result of the comparison, wherein the second analog control signal has one of two levels.

Example 23 includes the subject matter of example 19, including or omitting optional elements, wherein the transistor is a field-effect transistor and wherein the non-linear second control loop is configured to generate the second analog control signal depending on the analog output voltage level, wherein the second analog control signal causes charge to be extracted from a gate of the field-effect transistor when the analog output voltage level is above a first threshold and causes charge to be fed to the gate of the field-effect transistor when the analog output voltage level is below a second threshold.

Example 24 includes the subject matter of example 19, including or omitting optional elements, wherein the non-linear second control loop is configured not to feed the second analog control signal to the control input of the transistor if the analog output voltage level lies within a pre-defined tolerance range.

Example 25 is an electronic device as described above with reference to FIG. 10.

Example 26 is the electronic device according to example 25, wherein the controller is configured to generate the digital control signal for the transistor from the control error between the output voltage level indicated by the digital measurement signal and a reference variable for the output voltage.

Example 27 is the electronic device according to example 25 or 26, wherein the controller is a PI controller.

Example 28 is the electronic device according to one of the examples 25 to 27, wherein the delta-sigma digital-to-analog converter is configured to feed the first analog control signal to the control input of the transistor via a low-pass filter.

Example 29 is the electronic device according to one of the examples 25 to 28, wherein the non-linear control loop comprises a comparator which is configured to compare the analog level of the output voltage with a threshold value and to generate the second analog control signal depending on a result of the comparison.

Example 30 is the electronic device according to one of the examples 25 to 29, wherein the non-linear control loop comprises an analog-digital converter, which is configured to convert the analog level of the output voltage into a digital level of the output voltage, to compare the digital level of the output voltage with a threshold value and to generate the second analog control signal depending on a result of the comparison.

Example 31 is the electronic device according to one of the examples 25 to 30, wherein the second analog control signal has one of two levels.

Example 32 is the electronic device according to one of the examples 25 to 31, wherein the transistor is a field-effect transistor and wherein the non-linear second control loop is configured to generate the analog control signal depending on the analog level of the output voltage in such a way that it extracts charge from the gate of the field-effect transistor or that it feeds charge to the gate of the field-effect transistor.

Example 33 is the electronic device according to one of the examples 25 to 31, wherein the non-linear second control loop is configured not to feed the second analog control signal to the control input of the transistor when the analog level of the output voltage lies within a predefined tolerance range.

Example 34 is the electronic device according to one of the examples 25 to 34, comprising a microcontroller with a processor, wherein the controller is implemented by a software task running on the processor.

Example 35 is the electronic device according to example 34, wherein the microcontroller contains the delta-sigma analog-to-digital converter and the delta-sigma digital-to-analog converter.

Example 36 is the electronic device according to example 34 or 35, wherein the second non-linear control loop is implemented by a digital-to-analog converter or a comparator of the microprocessor, a further software task running on the processor, and an output interface of the microcontroller.

Example 37 is the electronic device according to one of the examples 25 to 36, wherein the electronic device is a radar device and the component to be supplied is a monolithic microwave integrated circuit.

Although the invention has mainly been shown and described by reference to specific embodiments, it should be understood by those familiar with the technical field that numerous changes can be made with regard to its design and details without departing from the nature and scope of the invention, as defined by the following claims. The scope of the invention is therefore defined by the attached claims and it is intended that any changes that fall within the literal meaning or equivalent scope of the claims are included.

LIST OF REFERENCE SIGNS 100 electronic device
101 device to be supplied
102 supply line
103 pass device
104 control component
200 low-dropout voltage regulator
201 component to be supplied
202 supply line
203 pass device
204 differential amplifier
300 radar device
301 MMIC
302 supply line
303 voltage regulator
304 microcontroller
305 power supply circuit
401 component to be supplied
402 supply line
403 pass device
404 microcontroller
405 control signal
406 detected signal
501 component to be supplied
502 supply line
503 field-effect transistor
504 microcontroller
505 delta-sigma analog-to-digital converter
506 software task
507 sigma-delta digital-to-analog converter
508 low-pass filter
603 transistor
604 microcontroller
605 ADC
606 controller
607 DAC
608 low-pass filter
609 analog-to-digital converter
610 software task
611 GPIO
612 resistor 700 radar device
701 MMIC
702 supply line
703 transistor
704 microcontroller
705 power supply circuit
706 HSDPM
707 pre-regulator
801 DAC
802 ADC
803 step-down converter
901 load current graph
902 output voltage graph
903 gain-voltage graph
904 fluctuation region
1000 electronic device
1001 component to be supplied
1002 supply line
1003 transistor
1004 transistor control input
1005 delta-sigma analog-digital converter
1006 controller
1007 delta-sigma digital-to-analog converter
1008 non-linear control loop

What is claimed is:

1. An electronic device, comprising:
a component to be supplied;
a supply line providing a supply voltage;
a transistor to which the supply voltage is fed from the supply line, the transistor comprising a control input and configured to output an output voltage depending on a signal applied to the control input to supply the component;
a linear first control loop, comprising
a delta-sigma analog-to-digital converter configured to convert an analog output voltage level into a digital measurement signal,
a controller configured to generate a digital control signal for the transistor depending on the digital measurement signal, and
a delta-sigma digital-to-analog converter configured to convert the digital control signal into a first analog control signal and feed it to the control input of the transistor;
a non-linear second control loop, configured to generate a second analog control signal depending on the analog output voltage level and feed it to the control input of the transistor, wherein the second analog control signal is superimposed with the first analog control signal; and
a microcontroller with a processor, wherein the controller is implemented by a software task running on the processor, wherein the non-linear second control loop is implemented by a digital-to-analog converter or a comparator of the microcontroller, a further software task running on the processor, and an output interface of the microcontroller.

2. The electronic device of claim 1, wherein the controller is configured to generate the digital control signal for the transistor from a control error between an output voltage level indicated by the digital measurement signal and a reference variable for the output voltage.

3. The electronic device of claim 1, wherein the controller is a PI controller.

4. The electronic device of claim 1, wherein the delta-sigma digital-to-analog converter is configured to feed the first analog control signal to the control input of the transistor via a low-pass filter.

5. The electronic device of claim 1, wherein the non-linear second control loop comprises a comparator configured to
compare the analog output voltage level with a threshold value, and
generate the second analog control signal dependent on a result of the comparison.

6. The electronic device of claim 1, wherein the non-linear second control loop comprises an analog-to-digital converter configured to
convert the analog output voltage level into a digital level of the output voltage,
compare the digital level of the output voltage with a threshold value, and
generate the second analog control signal depending on a result of the comparison.

7. The electronic device of claim 1, wherein the second analog control signal has one of two levels.

8. The electronic device of claim 1, wherein the transistor is a field-effect transistor and wherein the non-linear second control loop is configured to generate the second analog control signal depending on the analog output voltage level, wherein charge is extracted from a gate of the field-effect transistor or charge is fed to the gate of the field-effect transistor based on the second analog control signal.

9. The electronic device of claim 1, wherein the non-linear second control loop is configured not to feed the second analog control signal to the control input of the transistor if the analog output voltage level lies within a pre-defined tolerance range.

10. The electronic device of claim 1, wherein the microcontroller comprises the delta-sigma analog-to-digital converter and the delta-sigma digital-to-analog converter.

11. The electronic device of claim 1, wherein the electronic device is a radar device and the component to be supplied is a monolithic microwave integrated circuit.

12. A method for controlling an output voltage supplied to a component of an electronic device, comprising:
generating a first control signal based on a control error between an output voltage level of a transistor and a reference variable for the output voltage level;
generating a second control signal based on a comparison of the output voltage level of the transistor and at least one threshold voltage to exhibit either a first value that causes charge to be extracted from a gate of the transistor when the output voltage level exceeds a first threshold or a second value that causes charge to be fed to the gate of the transistor when the output voltage level is below a second threshold; and
feeding the first control signal and the second control signal, superimposed with respect to one another, to a gate of the transistor to control the transistor to output the output voltage.

13. The method of claim 12, comprising:
converting the output voltage level into a digital measurement signal,
generating a digital control signal for the transistor depending on the digital measurement signal, and
converting the digital control signal into the first control signal.

14. The method of claim 12, comprising filtering the first control signal with a low-pass filter and feeding the filtered first control signal to the gate of the transistor.

15. The method of claim 12, comprising generating the second control signal to exhibit a third value that causes the gate of the transistor to be tied to a high impedance input when the output voltage level lies between the first threshold and the second threshold.

16. A power supply system for a component of an electronic device, comprising:
- a transistor to which supply voltage is fed from a supply line, the transistor comprising a control input and configured to output an output voltage depending on a signal applied to the control input, wherein the output voltage is provided to the component;
- a linear first control loop, comprising
  - a delta-sigma analog-to-digital converter configured to convert an analog output voltage level into a digital measurement signal,
  - a controller configured to generate a digital control signal for the transistor depending on the digital measurement signal, and
  - a delta-sigma digital-to-analog converter configured to convert the digital control signal into a first analog control signal and feed it to the control input of the transistor; and
- a non-linear second control loop, configured to generate a second analog control signal depending on the analog output voltage level and feed it to the control input of the transistor, wherein the second analog control signal is superimposed with the first analog control signal, wherein the transistor is a field-effect transistor and wherein the non-linear second control loop is configured to generate the second analog control signal depending on the analog output voltage level, wherein the second analog control signal causes charge to be extracted from a gate of the field-effect transistor when the analog output voltage level is above a first threshold and causes charge to be fed to the gate of the field-effect transistor when the analog output voltage level is below a second threshold.

17. The power supply system of claim 16, wherein the controller is configured to generate the digital control signal for the transistor from a control error between an output voltage level indicated by the digital measurement signal and a reference variable for the output voltage.

18. The power supply system of claim 16, comprising a low-pass filter and wherein the delta-sigma digital-to-analog converter is configured to feed the first analog control signal to the control input of the transistor via the low-pass filter.

19. The power supply system of claim 16, wherein the non-linear second control loop comprises an analog-to-digital converter configured to
- convert the analog output voltage level into a digital level of the output voltage,
- compare the digital level of the output voltage with at least one threshold value, and
- generate the second analog control signal depending on a result of the comparison, wherein the second analog control signal has one of two levels.

20. The power supply system of claim 16, wherein the non-linear second control loop is configured not to feed the second analog control signal to the control input of the transistor if the analog output voltage level lies within a pre-defined tolerance range.

* * * * *